United States Patent
Heck et al.

(10) Patent No.: US 6,719,034 B2
(45) Date of Patent: Apr. 13, 2004

(54) PROCESS FOR PRODUCING A TUBE-SHAPED CATHODE SPUTTERING TARGET

(75) Inventors: Ralf Heck, Hanau (DE); Rainer Jüttner, Hasselroth (DE); David Lupton, Gelnhausen (DE); Egon Maier, Hasselroth (DE); Peter Mainz, Ronneburg (DE); Harald Manhardt, Bruchköbel (DE); Bernd Stenger, Hammersbach (DE); Holger Zingg, Biebergemünd (DE)

(73) Assignee: W. C. Heraeus GmbH & Co. KG (DE)

( * ) Notice: Subject to any disclaimer, the term of this patent is extended or adjusted under 35 U.S.C. 154(b) by 0 days.

(21) Appl. No.: 10/025,284

(22) Filed: Dec. 19, 2001

(65) Prior Publication Data

US 2003/0089482 A1 May 15, 2003

(30) Foreign Application Priority Data

Dec. 19, 2000 (DE) ........................ 100 63 383

(51) Int. Cl.$^7$ ........................... B22D 19/00; B22D 27/04
(52) U.S. Cl. ........................... 164/103; 164/125
(58) Field of Search ........................ 164/91, 93, 95, 164/98, 99, 100, 103, 105, 107, 112, 122, 122.1, 125, 126, 128, 338.1

(56) References Cited

U.S. PATENT DOCUMENTS 4,033,401 A * 7/1977 Wlodawer ............... 164/121
4,964,453 A * 10/1990 Schmidt et al. .......... 164/122.1
5,354,446 A * 10/1994 Kida et al. ............ 204/298.22
6,409,897 B1 * 6/2002 Wingo ................. 204/298.13

FOREIGN PATENT DOCUMENTS

| DE | 24 27 098 | 9/1975 | ............ B22C/9/04 |
| DE | 35 32 131 | 3/1987 | ............ B22D/27/20 |
| DE | 42 16 870 | 1/1993 | ............ B22D/27/04 |
| EP | 092 477 | 10/1983 | ............ B22D/7/04 |
| EP | 0 092 477 A1 * | 10/1983 | ............ B22D/7/04 |

* cited by examiner

Primary Examiner—Kiley Stoner
Assistant Examiner—Kevin P. Kerns
(74) Attorney, Agent, or Firm—Ostrolenk, Faber, Gerb & Soffen, LLP

(57) ABSTRACT

A process for producing a tube target for cathode sputtering plants, in which the tube target is formed from a metallic inner tube (target holder) made of a first material with a first melting point of $T_{s1} \geq 900$ K and a metallic outer tube (target) that concentrically surrounds the inner tube and that is made of a second material with a second melting point of $T_{s2} \leq 800$ K. The inside diameter of the outer tube and the outside diameter of the inner tube are proportioned in such a way that the two tubes fit together tightly and are mechanically firmly joined. The outer tube is formed by casting the second material in a molten state in a heated, vertical, cylindrical permanent mold, which has a heated mandrel that constitutes the inner tube. After a space between the mold and the inner tube has been filled with the molten second material, a first thermal gradient develops between the inner tube and the mold, a second thermal gradient develops between the bottom and the top of the mold, and the outer tube is simultaneously cooled from the inside to the outside and from the bottom to the top.

23 Claims, 2 Drawing Sheets

PROCESS FOR PRODUCING A TUBE-SHAPED CATHODE SPUTTERING TARGET

BACKGROUND OF THE INVENTION

The invention concerns a process for producing a tube-shaped target for cathode sputtering plants, in which the tube-shaped target is formed from a metallic inner tube (target holder) made of a first material with a first melting point of $T_{s1} \geqq 900$ K and a metallic outer tube (target) that concentrically surrounds the inner tube and that is made of a second material with a second melting point of $T_{s2} \leqq 800$ K. The inside diameter of the outer tube and the outside diameter of the inner tube are proportioned in such a way that the two tubes fit together tightly and are mechanically firmly joined. The invention also concerns the use of the process. Tube-shaped targets or rotating targets are increasingly preferred over planar targets for producing thin coatings, since they allow higher sputtering yields in the physical vapor deposition process or sputtering process. The use of tube-shaped targets to produce thin oxide coatings by reactive sputtering of metals under oxygen-containing atmospheres is especially advantageous. In this case, the oxides of low-melting metals, such as tin, zinc, indium, bismuth, or their alloys, are preferably deposited as thin coatings. These low-melting metals are subject to creep even at room temperature or at the slightly elevated temperatures that prevail during the sputtering process. Creep occurs at temperatures that are equal to or greater than 40% of the melting point of the metal. To prevent creep deformation, outer tubes made of these types of metals are usually supported by an inner tube that consists of a material with a higher melting point and that is usually cooled. It is necessary to produce contact with good adhesion between the two tubes over their entire surface area in order to ensure good heat transfer.

U.S. Pat. No. 5,354,446 describes various production processes for tube-shaped targets with an inner tube or target support tube and an outer tube or target tube made of soft, low-melting or fracture-susceptible metals or alloys. In one of these processes, the outer tube is applied to the inner tube by thermal spraying. In another process, the tube outer tube is joined to the inner tube with indium solder. Furthermore, the cited patent describes the use of adhesion-improving coatings between the inner and outer tubes, which allow adaptation of the different coefficients of thermal expansion of the inner and outer tubes. In addition, a process is described in which the outer tube is applied to the inner tube by hot isostatic pressing.

The cited processes are expensive, labor-intensive, and problematic. For example, the full-surface joining of the inner and outer tubes by soldering is generally difficult due to the geometric circumstances. This process turns out to be especially difficult when an outer tube made of a low-melting material is to be soldered, since the melting points of the outer tube and the solder often fall within very similar ranges.

Application of the outer tube by thermal spraying causes irregularities in the structure of the outer tube. On the one hand, these irregularities are caused by gas inclusions in the form of pores, gas inclusions in dissolved form, or inclusions of oxide particles in sprayed metallic coatings. On the other hand, the necessity of applying the outer tube in layers due to the process technology involved in thermal spraying results in a nonuniform structure of shells built up in the outer tube, which results in poor adhesion to the inner tube. These types of structural problems manifest themselves in nonuniform deposition rates during the cathode sputtering process. Gas inclusions in pores can lead to deflagration and material spalling, since the sputtering is carried out in a vacuum. Oxygen dissolved in the structure affects the stoichiometry and makes it difficult to control during the deposition of an oxide.

The production of cylindrical metal tubes by casting is also well known. For example, DE 2 427 098, DE 3 532 131 A1, and DE 4 216 870 A1 each discloses a casting process for producing metal parts with permanent molds, in which the goal is to achieve directional solidification of the molten metal for the purpose of producing a directional structure that is as uniform as possible. The directional solidification of the molten metal is achieved by cooling in a directional temperature field, such that the permanent mold is cooled from the bottom to the top. The thermal gradient is achieved, for example, by lowering the mold into an immersion bath, cooling it with air, or surrounding it with heating elements.

EP 092 477 describes the vertical core casting of a steel ingot in a permanent mold, in which a cooled, hollow metal mandrel is used as the core. A gas or vapor is fed into the hollow mandrel for cooling, such that the gas or vapor flows from the bottom of the mold through the hollow mandrel towards the top of the mold. The hollow mandrel adheres to the steel ingot after the mold has cooled, but no metal joining occurs between the two, as would occur in welding or soldering. This prevents a breakthrough or melt-through of the hollow mandrel during casting and the formation of hot cracks in the cast steel ingot.

SUMMARY OF THE INVENTION

Accordingly, it is an object of the present invention to provide a simple and inexpensive process for producing tube-shaped targets for cathode sputtering plants, with which a high degree of purity and a directional structure can be produced in an outer tube with a melting point of $\leqq 800$ K to be used as a sputtering target. There is the further object of providing an application for a process of this type.

In accordance with the invention, this object is achieved by forming the outer tube by casting the second material in a molten state in a heated, vertical, cylindrical permanent mold, which has a heated mandrel that constitutes the inner tube, in such a way that, after a space between the mold and the inner tube has been filled with the molten second material, a first thermal gradient develops between the inner tube and the mold. A second thermal gradient develops between the bottom and the top of the mold, and the outer tube is simultaneously cooled from the inside to the outside and from the bottom to the top.

This process has the advantage that a sufficient amount of metal feed can continue to be supplied to the casting, so that the formation of blowholes is minimized. Entrapped gas bubbles are able to move upward and escape from the mold. A directional, very uniform, and clean structure with columnar crystallites is formed, with the columns aligned perpendicularly to the surface of the outer tube. In addition, a metallic bond is produced between the outer and inner tube, which results in a high level of adhesion and ideal heat transfer.

The second material is preferably melted under an atmosphere of inert gas or in a vacuum and then fed into the mold by a molten metal pump or a siphon to suppress the formation of oxides and impurities as much as possible.

The second thermal gradient is preferably produced by heating the mold with at least two separately controllable heating devices that radially surround the mold. In this connection, it is advantageous to use electric heating mats as the heating devices. Heating mats of this type are made of heating conductors embedded in an insulating material, and their flexibility makes it possible to fit them snugly around the mold. The inner tube is preferably heated with hot gas or steam at its inside diameter.

The mold and inner tube are preferably preheated to a temperature of 400–850 K before the casting process begins. Preheating prevents solidification of the melt from occurring too quickly on the inside wall of the mold and on the outside wall of the inner tube, which would lead to irregularities in the structure of the outer tube. It was found to be especially advantageous to preheat at least the mold to a temperature that is greater than the melting point $T_{s2}$ of the second material, so that solidification of the molten metal on the inside wall of the mold is completely prevented during the filling of the mold.

It has been found to be advantageous to use high-grade steel, aluminum, or copper as the first material. The melting points of these materials are significantly higher than those of the second material, which completely rules out the possibility that the inner tube could melt through during the casting process.

Tin, zinc, bismuth, indium, or an alloy of these metals is preferably used as the second material.

To improve the formation of the metallic bond between the outer tube and the inner tube, the inner tube can be pretreated before the outer tube is cast by applying a bonding agent to the outside surface of the inner tube in a coating thickness of 5–500 μm. For this purpose, a coating of solder can be applied as the coating of bonding agent, with the use of a flux. The coating of bonding agent can be produced at least in part by electro-deposition or electroless plating, or it can be produced by thermal spraying.

It has been found to be effective to use an inner tube made of high-grade steel and to apply the coating of solder as the bonding agent with the use of the flux, such that the coating of solder consists at least partly of the second material. It has also been found to be effective to use an inner tube made of aluminum or copper and to produce the coating of bonding agent at least in part by electro-deposition or electroless plating, such that the coating of bonding agent consists at least partly of the second material. After electro-deposition or electroless plating, it may make sense to additionally apply a coating of solder. It has also been found to be effective to produce the coating of bonding agent by thermal spraying, especially the thermal spraying of nickel.

The first thermal gradient is ideally produced by discontinuing the heating of the inside diameter of the inner tube. In addition, it has been found to be effective to pass cold gas or water vapor through the inside of the inner tube. The second thermal gradient is preferably produced by shutting off the two or more heating devices at different times. The heating device near the bottom of the mold is shut off first, and then the one or more remaining heating devices adjacent to and above the first heating device are shut off after a certain amount of delay. In this connection, one separately controllable heating device should be provided for each 30–50 cm of vertical length of the mold in order to produce a smooth course of the second thermal gradient.

To allow easy removal of the tube-shaped target from the mold after it has cooled, the mold should consist of at least two radially separable parts.

The process of the invention is preferably used to produce outer tubes with a thickness of 3–12 mm.

Ideally, the process is used to produce a tube-shaped target for cathode sputtering plants with an oxygen concentration in the outer tube of $\leq 100$ ppm and a structure composed of columnar crystallites that are aligned perpendicularly to the surface of the outer tube.

The process is preferably used to establish an oxygen concentration of $\leq 50$ ppm and an average particle size of the columnar crystallites of 0.3 mm to 15 mm.

The various features of novelty which characterize the invention are pointed out with particularity in the claims annexed to and forming a part of the disclosure. For a better understanding of the invention, its operating advantages, and specific objects attained by its use, reference is made to the drawings and descriptive matter in which there are illustrated and described preferred embodiments of the invention.

DETAILED DESCRIPTION OF THE PREFERRED EMBODIMENTS

Figure 1:
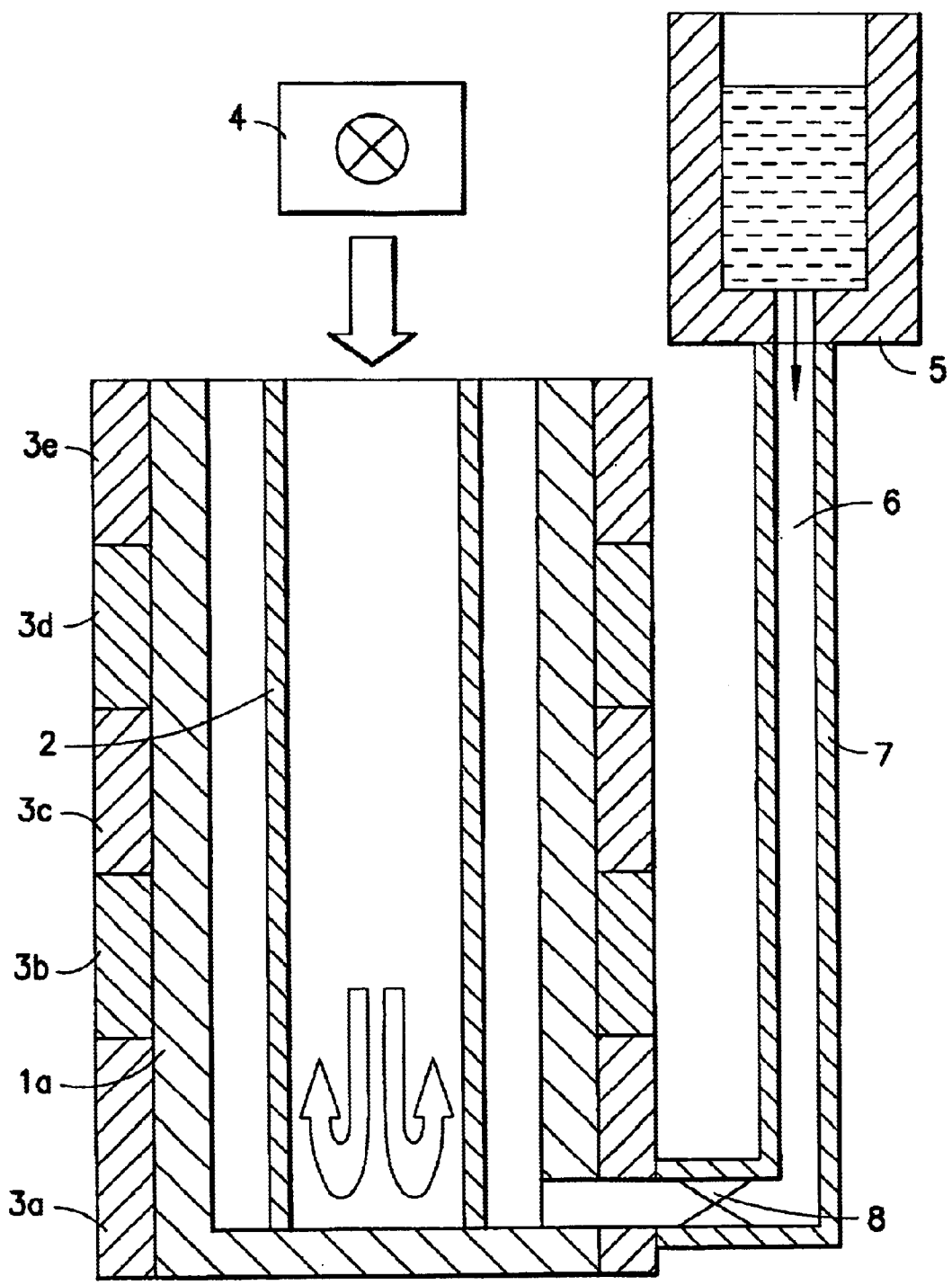
FIG. 1: schematically shows casting equipment for carrying out the process of the invention with a permanent mold that is closed at the bottom.

The invention will be discussed below in connection with the following examples.

Example 1: Production of a tube-shaped target with an outer tube made of tin and an inner tube made of high-grade steel.

Example 2: Production of a tube-shaped target with an outer tube made of zinc and an inner tube made of high-grade steel.

Comparison Example: Use of thermal spraying to produce a tube-shaped target with an outer tube made of zinc.

EXAMPLE 1

The outer surface of an inner tube made of high-grade steel (inside diameter 127 mm, outside diameter 133 mm, length 1,500 mm) is coated with a layer of tin solder with the use of a commercial flux. The solder-covered inner tube is centrically arranged in a two-part mold. The mold is heated from the outside with heating mats to about 300° C., and the inner tube is heated from the inside by a hot-air fan, likewise to about 300° C. Tin with a purity of 99.99% is melted under an argon atmosphere in a crucible, which is connected with the mold by a siphon (see also FIG. 1). The molten tin is fed into the mold through a heated pipe and fills the space between the inner tube and the mold up to the top edge of the mold. The hot-air fan is then turned off, and, beginning from the bottom of the mold, the heating mats are successively turned off and removed. The level of the molten metal is prevented from dropping by feeding in more molten tin at the upper end of the mold. After cooling and complete solidification of the tin had occurred, and the outer tube had formed with a thickness of 14 mm, the mold was removed, and the outer tube was machined to produce a uniform surface. In addition, the length of the outer tube was cut down to 1350 mm to expose the high-grade steel inner tube at both ends.

Subsequent examination of the structure of the tube-shaped target showed that columnar tin crystallites with an average particle size of 8 mm had formed. The columnar crystallites were aligned perpendicularly to the surface of the outer tube and were very uniform over both the length and circumference of the outer tube. The oxygen concentration of the tin was determined by LECO hot extraction gas analysis to be 7 ppm. No inclusions, pores, or blowholes could be observed in the tin. Ultrasonic testing showed that the adhesion of the outer tube to the inner tube was excellent.

EXAMPLE 2

The outer surface of an inner tube made of high-grade steel (inside diameter 127 mm, outside diameter 133 mm, length 1,500 mm) is coated with a layer of zinc solder with the use of a commercial flux. The solder-covered inner tube is centrically arranged in a two-part mold. The mold is heated from the outside with heating mats to about 500° C., and the inner tube is heated from the inside by a hot-air fan, likewise to about 500° C. Zinc is melted under an argon atmosphere in a crucible, which is connected with the mold by a siphon (see also FIG. 1). The molten zinc is fed into the mold through a heated pipe and fills the space between the inner tube and the mold up to the top edge of the mold. The hot-air fan is then turned off, and, beginning from the bottom of the mold, the heating mats are successively turned off and removed. The level of the molten metal is prevented from dropping by feeding in more molten zinc at the upper end of the mold. After cooling and complete solidification of the zinc had occurred, the mold was removed, and the tube-shaped target was processed as described in Example 1.

Subsequent examination of the structure of the tube-shaped target showed that columnar zinc crystallites with an average particle size of 1.7 mm had formed. The columnar crystallites were aligned perpendicularly to the surface of the outer tube and were very uniform over both the length and circumference of the outer tube. The oxygen concentration of the zinc was determined by LECO hot extraction gas analysis to be 20 ppm. No inclusions, pores or blowholes could be observed in the zinc. Ultrasonic testing showed that the adhesion of the outer tube to the inner tube was excellent.

COMPARISON EXAMPLE

A zinc wire with a diameter of 3.1 mm and an oxygen concentration of 28 ppm determined by LECO hot extraction gas analysis was applied in layers (about 0.1 mm per layer) to a highgrade steel inner tube by flame spraying under an argon atmosphere. The zinc outer tube produced in this way was 10 mm thick. Subsequent examination of the structure of the tube-shaped target revealed the presence of many oxide inclusions with diameters of about 0.02 mm each between the successively applied layers of zinc, each of which was about 0.1 mm thick. A large number of pores was also observed in the outer tube. Despite 200× magnification, no individual crystallites could be found in the metallographic section. Despite repeated experiments and measures taken to improve the results, it was not possible to achieve an oxygen concentration in the zinc of less than 2500 ppm.

FIG. 1 shows a cylindrical, vertical mold 1a and an inner tube (target holder) 2 that is centrically arranged in the mold 1a. The mold 1a is surrounded by electric heating mats 3a, 3b, 3c, 3d, 3e. A hot-air blower 4 is provided for heating the inner tube 2. The hot air hits the bottom of the mold 1a and is directed back towards the hot-air blower 4. A crucible 5 for holding and melting the second material is set above the upper edge of the mold 1a and connected by a siphon or pipe 6 with the space between the mold 1a and the inner tube 2. The siphon or pipe 6 is heated by strip heaters 7 to prevent cooling or solidification of the molten second material as it is fed from the crucible 5 to the mold 1a. A valve 8 between the siphon or pipe 6 and the mold 1a allows systematic filling of the space between the mold 1a and the inner tube 2.

Figure 2:
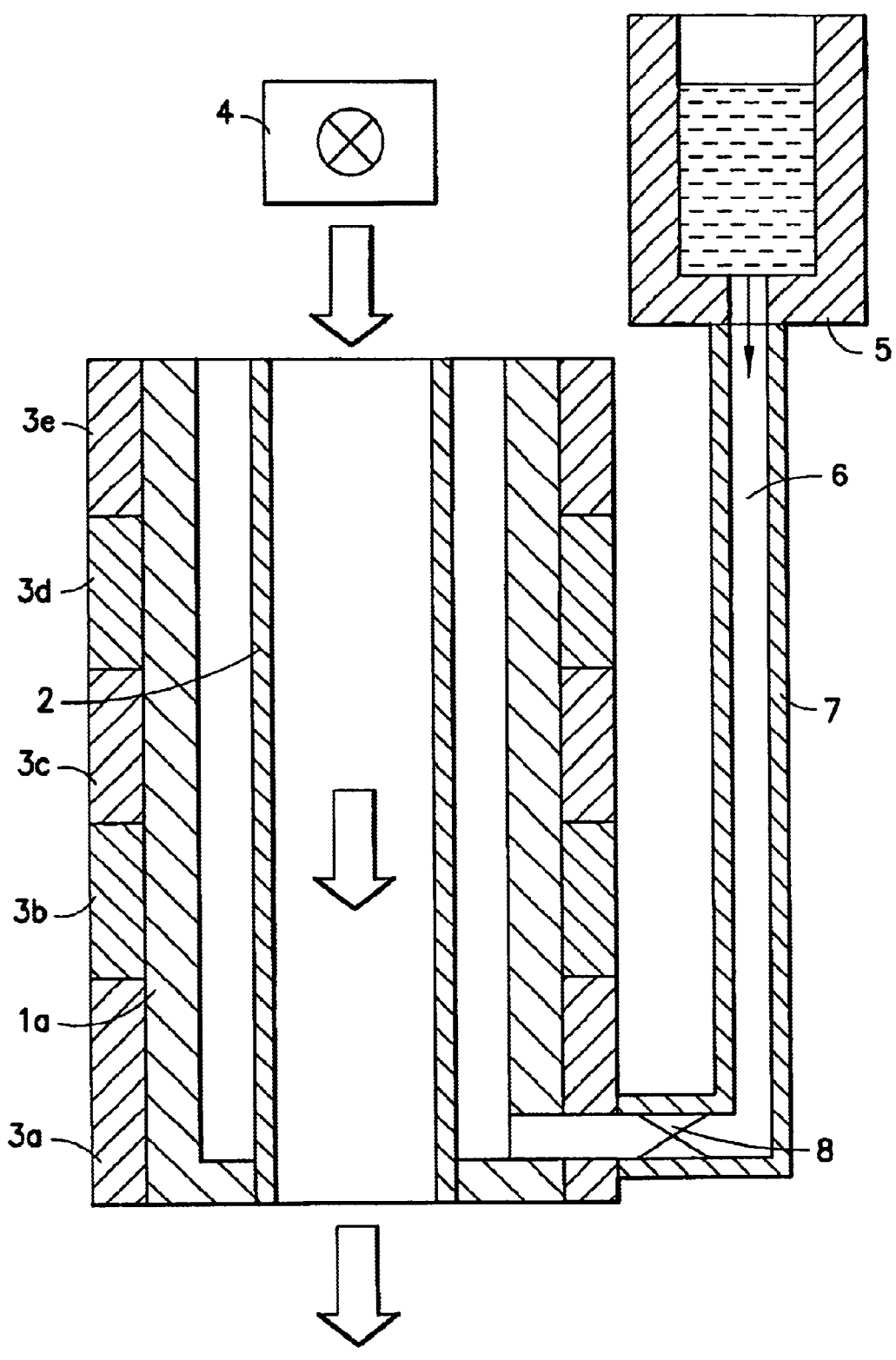
FIG. 2: schematically shows casting equipment for carrying out the process of the invention with a permanent mold that has an opening at the bottom.

FIG. 2 shows a cylindrical, vertical mold 1b and an inner tube (target holder) 2 that is centrically arranged in the mold 1b. The mold 1b is surrounded by electric heating mats 3a, 3b, 3c, 3d, 3e. A hot-air blower 4 is provided for heating the inner tube 2. In this case, the inner tube 2 passes through an opening in the base of the mold 1b, with the result that the hot air escapes through the opening. A crucible 5 for holding and melting the second material is set above the upper edge of the mold 1b and connected by a siphon or pipe 6 with the space between the mold 1b and the inner tube 2. The siphon or pipe 6 is heated by strip heaters 7 to prevent cooling or solidification of the molten second material as it is fed from the crucible 5 to the mold 1b. A valve 8 between the siphon or pipe 6 and the mold 1b allows systematic filling of the space between the mold 1b and the inner tube 2.

Thus, while there have been shown and described and pointed out fundamental novel features of the present invention as applied to a preferred embodiment thereof, it will be understood that various omissions and substitutions and changes in the form and details of the devices illustrated, and in their operation, may be made by those skilled in the art without departing from the spirit of the present invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

We claim:

1. A process for producing a tube target for cathode sputtering plants, comprising the steps of:
producing a metallic inner tube (target holder) of a first material with a first melting point of $T_{s1} \geq 900$ K;
producing a metallic outer tube (target) that concentrically surrounds the inner tube and is made of a second material with a second melting point of $T_{s2} \leq 800$ K, the tubes being produced so that an inside diameter of the outer tube and an outside diameter of the inner tube are proportioned in such a way that the two tubes fit together tightly and are mechanically firmly joined, the step of producing the outer tube including forming the outer tube by casting the second material in a molten state in a heated, vertical, cylindrical permanent mold, the inner tube forming a heated mandrel for the cylindrical mold; and, after a space between the mold and the inner tube has been filled with the molten second material, cooling the outer tube from inside to outside and from bottom to top by actively developing a first, radial thermal gradient between the inner tube and the mold and a second thermal, longitudinal gradient between a bottom and a top of the mold.

2. A process in accordance with claim 1, including heating the mold with at least two separately controllable heating devices that radially surround the mold.

3. A process in accordance with claim 2, including heating the mold with electric heating mats.

4. A process in accordance with claim 1, including heating the inner tube at its inner diameter with one of hot gas and steam.

5. A process in accordance with claim 1, including preheating the mold and the inner tube to a temperature of 400–850 K.

6. A process in accordance with claim 5, including preheating at least the mold to a temperature greater than the melting point $T_{s2}$ of the second material.

7. A process in accordance with claim 1, wherein the first material is one of high-grade steel, aluminum, and copper.

8. A process in accordance with claim 1, wherein the second material is one of tin, zinc, bismuth, indium, or an alloy containing one or more of these metals.

9. A process in accordance with claim 1, including pretreating the inner diameter of the inner tube before the outer tube is cast by applying a coating of bonding agent to the outer surface of the inner tube in a coating thickness of 5–500 μm.

10. A process in accordance with claim 9, wherein the pretreating step includes applying a coating of solder using a flux as the coating of bonding agent.

11. A process in accordance with claim 9, including producing the coating of bonding agent at least in part by one of electro-deposition and electroless plating.

12. A process in accordance with claim 9, including producing the coating of bonding agent by thermal spraying.

13. A process in accordance with claim 10, including using an inner tube made of highgrade steel, applying the coating of solder, the solder consisting at least in part of the second material.

14. A process in accordance with claim 11, including using an inner tube made of one of aluminum and copper, applying the coating of bonding agent, the bonding agent consisting at least in part of the second material.

15. A process in accordance with claim 12, including producing the coating of bonding agent by thermal spraying nickel.

16. A process in accordance with claim 1, including producing the first thermal gradient by discontinuing heating of the inside of the inner tube.

17. A process in accordance with claim 16, including producing the first thermal gradient by causing one of cold gas and water vapor to flow through the inside of the inner tube.

18. A process in accordance with claim 2, including producing the second thermal gradient by shutting off the at least two heating devices at different times.

19. A process in accordance with claim 1, wherein the mold comprises at least two radially separable parts.

20. A process in accordance with claim 1, including producing the outer tube with a thickness of 3–12 mm.

21. A process for producing a tube-shaped cathode sputtering target with an oxygen concentration in an outer tube (target) of ≦100 ppm and with a structure composed of columnar crystallites that are aligned perpendicularly to the surface of the outer tube, the process comprising the steps of:

producing a metallic inner tube (target holder) of a first material with a first melting point of $T_{s1} \geqq 900$ K;

producing a metallic outer tube (target) that concentrically surrounds the inner tube and is made of a second material with a second melting point of $T_{s2} \leqq 800$ K, the tubes being produced so that an inside diameter of the outer tube and an outside diameter of the inner tube are proportioned in such a way that the two tubes fit together tightly and are mechanically firmly joined, the step of producing the outer tube including forming the outer tube by casting the second material in a molten state in a heated, vertical, cylindrical permanent mold, the inner tube forming a heated mandrel for the cylindrical mold; and, after a space between the mold and the inner tube has been filled with the molten second material, cooling the outer tube from inside to outside and from bottom to top by actively developing a first, radial thermal gradient between the inner tube and the mold and a second thermal, longitudinal gradient between a bottom and a top of the mold.

22. A process in accordance with claim 21, wherein the oxygen concentration is ≦50 ppm.

23. A process in accordance with claim 21, wherein the columnar crystallites have an average particle size of about 0.3 mm to about 15 mm.

* * * * *